United States Patent [19]

Greer et al.

[11] Patent Number: 5,104,695

[45] Date of Patent: Apr. 14, 1992

[54] METHOD AND APPARATUS FOR VAPOR DEPOSITION OF MATERIAL ONTO A SUBSTRATE

[75] Inventors: Stuart E. Greer; Eric E. Millham, both of Shelburne; Adolf E. Wirsing, South Hero, all of Vt.

[73] Assignee: International Business Machines Corporation, Armonk, N.Y.

[21] Appl. No.: 404,803

[22] Filed: Sep. 8, 1989

[51] Int. Cl.⁵ .............................................. C23C 16/00
[52] U.S. Cl. .................................... 427/250; 118/720; 118/726; 118/728; 427/282; 427/287; 437/245
[58] Field of Search ........................ 427/250, 282, 287; 118/720, 726, 728; 437/245

[56] References Cited

U.S. PATENT DOCUMENTS

| | | | |
|---|---|---|---|
| 2,378,476 | 6/1945 | Guellich | 427/250 |
| 2,612,442 | 9/1952 | Goetzel | 427/250 |
| 3,104,178 | 9/1963 | DaSilva | |
| 3,330,647 | 6/1967 | Hunt et al. | 427/250 |
| 3,446,936 | 5/1969 | Hanson et al. | 219/271 |
| 3,517,644 | 6/1970 | Baer | 118/49 |
| 3,690,638 | 9/1972 | Roblin | 427/250 |
| 3,690,933 | 9/1972 | Cole | 427/250 |
| 3,836,387 | 9/1974 | Roblin | 427/250 |

FOREIGN PATENT DOCUMENTS 782983 9/1957 United Kingdom .

OTHER PUBLICATIONS

IBM Technical disclosure Bulletin vol. 6, No. 7, Dec., 1963, p. 77.
IBM Technical disclosure Bulletin vol. 9, No. 5, Oct. 1966, p. 543.
IBM Technical Disclosure Bulletin vol. 9, No. 12, May 1967, p. 1677.
IBM Technical Disclosure Bulletin vol. 6, No. 4, Sep. 1963, p. 1.

Primary Examiner—Janyce Bell
Attorney, Agent, or Firm—Calfee Halter & Griswold

[57] ABSTRACT

A method and apparatus for depositing the material onto a substrate is provided. The apparatus includes a mesh member which has impregnated therein the material which is to be vapor deposited. The mesh member with the material thereon is heated to vaporize the material and the vaporized material is then deposited onto the desired substrate. Preferably the material that is deposited is maintained in a crucible having an opening and the mesh member is disposed over the opening. The material in the crucible is vaporized and condensed onto the mesh member, and the condensed material wicks through the mesh member and then revaporizes from the top of the mesh member and is deposited onto the substrates.

16 Claims, 1 Drawing Sheet

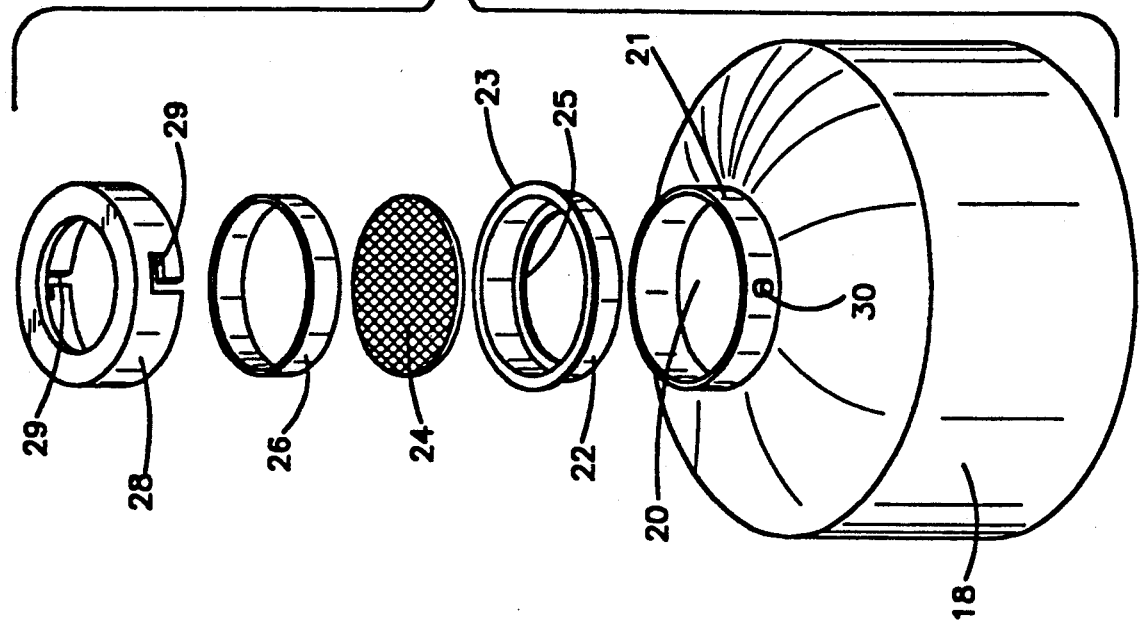
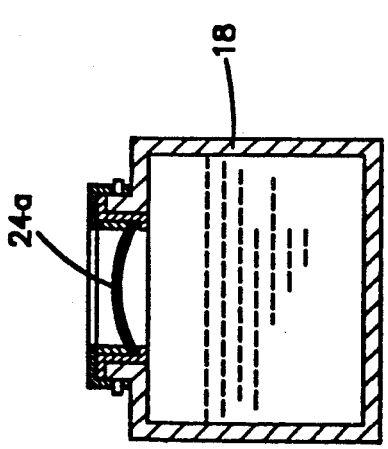
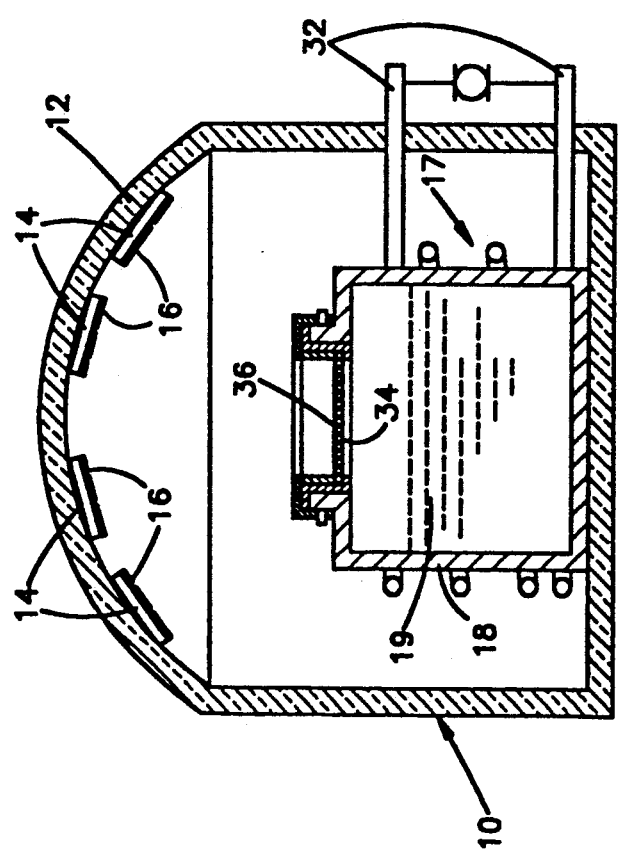

METHOD AND APPARATUS FOR VAPOR DEPOSITION OF MATERIAL ONTO A SUBSTRATE

BACKGROUND OF THE INVENTION

This invention relates generally to vapor deposition of materials onto substrates, and more particularly to a method and apparatus for vapor depositing material onto a substrate, which material is contained on a mesh or screen member.

It is conventional prior art practice to vapor deposit many different types of material onto many different substrates. This is done for many different purposes and to obtain many different resultant structures. In one particular application of vapor deposition, solder material is vapor deposited onto a semi-conductor wafer to form solder pads which will form sites to join chips formed from the substrate to a ceramic material. The present invention is particularly adapted for such type of vapor deposition of solder onto semi-conductor substrates although it is not specifically limited to such applications.

In the vapor deposition of solder onto substrates, it has been conventional prior art practice to provide a source of the solder material, which is disposed in a cup constructed of high-temperature alloy or ceramic material which allows the solder material to be melted and evaporated. The cup is conventionally heated by RF induction coils, but other means can be used, and the cup has an opening formed in the top. The melted and subsequently vaporized solder material escapes through the opening in the cup and is deposited onto semi-conductor substrates which are mounted within an enclosure in which the cup is supported. If discrete solder pads are required, then deposition conventionally is performed through a patterned mask, associated with the substrate.

One of the problems associated with this and with other types of vapor deposition techniques is what is known as "spitting" or "spattering". This phenomenon is characterized by fairly large globs of material being expelled from the melt through the opening and thence being deposited onto the substrate or onto the mask. Other difficulties encountered with the vapor deposition technique of using a cup and opening include the difficulty of obtaining uniform distribution of the solder material emanating from the cup. This is especially true in an arrangement wherein a plurality of substrates to be coated are supported in an array in a conventional dome-shaped container. With this particular coating process, uneven distribution can be a significant problem. Other problems encountered include limitation on deposition thickness and limited source volumes.

There have been several prior art proposals to overcome certain of these drawbacks. For example, Hanson, et al, U.S. Pat. No. 3,446,936, discloses, in one of the embodiments therein, a baffling arrangement to intercept spits and prevent spitting from the evaporant source. IBM Technical Disclosure Bulletin, Volume 6, No. 4, September, 1963, Page 1, shows an evaporation source for copper, wherein pin holes are punched through the bottom of the evaporation boat to allow the copper to come out in very small volumes. The problem of uneven deposition is addressed in the Baer U.S. Pat. No. 3,517,644, wherein various resistors to be coated are contained within a cage which is rotated during the vapor deposition.

Certain source configurations are shown in IBM Technical Disclosure Bulletin, Volume No. 9, No. 12, May, 1967, Page 1677; and evaporation mask coating features are disclosed in IBM Technical Disclosure Bulletin, Volume 9, No. 5, October, 1966, Page 543. A technique for controlling the rate of evaporation and measuring the rate is shown in IBM Technical Disclosure Bulletin, Volume No. 6, No. 7, December 1963, Page 77.

However, none of these references suggest the technique of the present invention for significantly reducing or even substantially eliminating the problem of spitting, nor do they suggest the technique for providing more uniform distribution of the vapor deposited material.

SUMMARY OF THE INVENTION

According to the present invention, a method and apparatus for vapor depositing material onto a substrate is provided. In the practice of this method, a mesh member is utilized which has the material to be vapor deposited disposed thereon or impregnated therein. The mesh member is heated to vaporize the material contained thereon or therein, with the mesh member being maintained within an enclosure in which the substrates to be coated are also maintained. In the preferred embodiment, the mesh member is a member which is mounted over the mouth of a melting cup or crucible, and the material in the cup is melted and evaporated. The evaporated material condenses on the mesh and the mesh member, being heated, re-evaporates the material condensed thereon and vapor deposits the re-evaporated material onto the substrate.

DESCRIPTION OF THE DRAWINGS

FIG. 1 is a longitudinal sectional view, somewhat diagrammatic, showing the present invention utilized in vapor depositing of solder onto semi-conductor substrates;

FIG. 2 is a perspective, exploded, detailed view of the assembly for evaporating solder material into a substrate according to this invention; and FIG. 3 is a longitudinal sectional view of a cup assembly of a slightly modified version according to the present invention.

DESCRIPTION OF THE PREFERRED EMBODIMENTS

Referring now to the drawings, and for the present, FIGS. 1 and 2. One embodiment of the present invention is shown, which is especially configured and adapted to evaporate a lead-tin solder material unto semi-conductor substrates which are mounted within a conventional, dome-shaped enclosure. As shown in FIG. 1, a conventional enclosure 10 is provided which is utilized for performing vapor deposition of solder materials, including lead-tin solder onto substrates. The enclosure 10 includes a dome-shaped portion 12 on which are mounted a plurality of semi-conductor substrates 14. The substrates 14 are conventionally provided with molybdenum masks 16 which are patterned to allow material to vapor deposit through selected patterned areas (not shown). The substrates 14 are mounted in an array on the dome portion 12 of the enclosure 10.

An evaporation assembly 17 is disposed within the enclosure 10 and is configured to vaporize and dispose lead-tin solder onto the substrates 12 through the masks 16. The evaporation assembly 17 includes a conventional crucible or cup 18 into which the selected solder material 19, which is to be evaporated, is disposed. The cup 18 has an opening 20 in the top thereof, surrounded by a rim 21 extending upwardly therefrom. In conventional melting practice the material 19 would normally be melted, vaporized and passed through the opening 20 and be disposed onto the substrates 14 through the masks 16. It is this type of melting and evaporation, which causes the problems of spitting and non-uniform distribution. The spitting or spattering occurs because of convection in the bulk melt causing drops to be spit. It is believed that this spitting is due to the rapid release of entrapped gases that evolve during the melting of the bulk source material. The gases probably emanate from impurities, both metallic and organic, within the melt, that are inseparable from the melt and have vapor pressures that differ from that of the bulk material. The non-uniform deposition is caused by virtue of the fact that the substrates are arranged in an hemispheric configuration on the dome 12 and the evaporation pattern does not conform to this configuration. This is especially true as the bulk source material is depleted from the crucible or cup and the subsequent evaporation angle between source and substrate changes. The present invention provides a screen assembly which includes a screen holder 22, having an upper lip 23 which allows the screen holder 22 to be inserted into the opening 20 with lip 23 coacting with the rim 21 to maintain the screen holder 22 in place.

A mesh screen 24 is disposed in the screen holder 22 and rests on a lower a lip 25 within the screen holder 22. A cylindrical retainer 26 is inserted within the holder 22 to maintain the screen 24 in place. The entire assembly is maintained in place by a nut 28, having grooves 29 which coact with bayonet lugs 30 formed on the rim 21.

The screen can be made of any heat resistant nonreactive material which provides a mesh configuration. One particularly well-adapted screen material configuration is a tungsten material formed of four to five mil diameter wires, spaced on four to five mil centers and woven and then configured with three layers of this material so that it is approximately fifteen to twenty mils thick. Such a material is optically opaque, but provides a porous mass of material for the reception of the vaporized material 19 as will be explained presently. A particularly well-suited screen material is a tungsten wire cloth provided by Unique Wire Weaving Co., having a twilltupe weave, a 15×300 weave pattern, with a wire diameter of 0.005".

The entire evaporation assembly 17 is disposed in the enclosure 10 and is surrounded by induction heating coils which are shown somewhat diagrammatically at 32. A source of power for the induction coils is provided which will allow the induction coils 32 to melt and then vaporize the material 19 contained within the cup 18. Other forms of heating, such as resistance, infrared, laser, glow discharge, ion bombardment, etc., can be used. The particular heat source is not critical, it being only required that the solder material be vaporized and condensed on the screen and the screen be heated to revaporize the material In the preferred embodiment a lead-tin solder which typically can be a nominally 96.5% lead, and 3.5% tin, is the material which is melted and then vaporized. According to the present invention, the vaporized material 19 will come in contact with the screen material 24 and will condense on the screen 24 into a liquid form. The screen material 24 acts as an absorbent member, much like a wick, to absorb the evaporated solder material 19 therein. The absorbent mesh structure wicks the condensed material from the lower surface 34, where it has condensed as a liquid, to the upper surface 36. At the upper surface 36, it is revaporized by virtue of the screens being heated and the revaporized material within the enclosure 10 deposits onto the substrates 14 through the masks 16 in a conventional manner. It has been found, surprisingly, that by the use of the mesh or screen material 24, there is a significant reduction in the amount of spitting which occurs. The reason for this reduction in spitting is not completely understood. However, it is believed that it is due at least in part to the fact that the material contained on the mesh is not contained as one homogeneous large volume or mass of material 19 as it is within the cup or crucible 18, but rather is maintained absorbed in the screen as a very large number small of discrete masses located in the interstices between the wires of the screen member 24. Because of this distribution of the material as a large number of very small discreet units of material, rather than a large unitary mass, it is believed that the conditions which cause spitting, i.e., the generation of gas bubbles in convection heating do not occur, and therefore the occurrence of spitting is repressed. However, for whatever reason, it has been found that the use of the material contained within a screen or mesh member 24 as the source of material for vapor deposition; substantially and significantly reduces the amount of spitting that does occur in the vapor deposition of the solder alloy.

Another advantage of utilizing what can be termed a mesh impregnated with the deposit material is the ability to control more uniformly the distribution of the material 19 as it is applied through the masks to the substrates. This is demonstrated by FIG. 3 wherein the screen material 24a is shown being formed in a generally hemispherical or dome-shaped configuration. Since the screen material 24a, which is the same material as the screen material 24 but is shaped into a dome, is a self-supporting solid material, it can be shaped into any desired configuration for providing the source of the material to be evaporated. Since in the preferred embodiment the substrates are arranged in a dome-shaped configuration, a similarly configured screen 26a allows the possibility of much closer control and more uniform distribution of the material as it evaporates from the screen 24a and strikes the substrates. The screen acts as a source at a fixed height. Even as the material in the crucible or cup is depleted, this configuration provides enhanced control of the substrate thickness uniformity during the entire deposition cycle. Of course, other configurations of the screen material could be used, depending upon what type of control of the deposition of the material onto substrates is required as would be understood by a person skilled in the art.

In the above described embodiments, the heated screen acts both as a condenser for the vaporized material coming from the cup 18 and also as a medium for revaporizing the material after it is condensed. The reason that this occurs is believed to be due to the difference in vapor pressure between the vaporized material between the cup 18 and screen 24 on one hand, and the vaporized material between the screen 24 and dome 12, which is much lower. Hence the higher vapor pressure causes condensation and the lower pressure allows evaporation both at the same temperature.

It is also to be understood that while the preferred method of depositing the material 19 onto the screen and thence onto the substrate, is to evaporate the material 19 continuously from a cup onto a screen where it condenses, wicks through and immediately re-evaporates, other techniques could be used to provide the material impregnated in the screen 24. For example, a separate step could be provided wherein the material is first impregnated onto the screen, either by vapor deposition or immersion in the material in liquid form and the screen then moved into the chamber and heated separately to evaporate the material onto the desired substrates. Alternatively, screens could be used having the material impregnated or otherwise disposed therein, which are stored and put into a necessary enclosure and heated as needed as a batch-type operation.

It is also to be understood that the type of heating of the screen is not critical. Such heating could be done in addition to the heating by RF coils by resistance heating, ion bombardment, infrared, laser, glow discharge, etc., as indicated above. Further, it is to be understood that the invention is not limited to the deposition of lead-tin solder material or even solder material, but can be used in other applications where material is required to be vapor deposited onto substrates.

The important aspects of the invention are that material that is to be deposited is maintained and held within a mesh material from whence it is evaporated onto substrate, the mesh material acting as a support for the material, with the material being evaporated therefrom with the attendant advantages described above.

While several embodiments of the invention have been shown and described, various adaptions and modifications can be made without departing from the scope of the invention as defined by the appended claims.

What is claimed is:

1. A method of vapor depositing a material on a substrate comprising the steps of continuously depositing said material onto said mesh member from a melted source of said material and continuously evaporating said material from said mesh member onto said substrate, whereby said mesh member has a configuration which prevents said material from being applied directly from said melted source of said material to said substrate.

2. The invention as defined in claim 1 wherein said material is contained in a crucible and the crucible and mesh member are heated to evaporate said material from the crucible and to initially condense said material onto the mesh member and wherein said material condenses onto said mesh member on one side thereof and evaporates from the opposite side thereof.

3. The method as defined in claim 2 wherein the material is a solder material.

4. The method as defined in claim 3 wherein the material is a lead/tin solder.

5. The method as defined in claim 1 wherein the material in the space between the mesh member and melted material in the crucible has a first vapor pressure and the material between the mesh member and the substrate has a second vapor pressure, and wherein the first vapor pressure is greater than the second vapor pressure.

6. The method as defined in claim 1 wherein said mesh member is a non-planar shape, whereby to vary the distribution of the material deposited on the substrate.

7. The invention as defined in claim 6 wherein the mesh member has generally a dome shape, and the substrate is supported equidistant from the dome-shaped member for receipt of the material.

8. The method as defined in claim 1 wherein said substrate is a semi-conductor wafer.

9. The method as defined in claim 8 wherein the material is a solder material, wherein a mask is interposed between said mesh member and the substrate to provide for selective deposition of the material.

10. A device for evaporating a material onto a substrate comprising; a mesh member, said mesh member having means and a configuration for absorbing said material and for preventing said material from passing directly through said mesh member, said material being initially absorbed within said mesh member, and means to heat said material absorbed in said mesh member to vaporize said absorbed material, and means to support the substrate positioned for the receipt of the vaporized material.

11. The device as defined in claim 10 further characterized by said mesh member having two opposed sides and means and a configuration to continuously condense and deposit material onto one side of said mesh member and continuously vaporize said material from the opposed side of said mesh member.

12. The device as defined in claim 11 further characterized by crucible means to contain said material, heating means to heat the material and vaporize the material in said crucible means and heat said mesh member, said crucible means including opening means being disposed in the opening of said crucible means whereby the vaporized material is deposited onto said one side of said mesh member and revaporized from said opposed side thereof.

13. The device as defined in claim 10 wherein said mesh member has a non-planar shape, and said substrate is supported equidistant from said non-planar mesh member providing a constant mesh member to substrate distance.

14. The device as defined in claim 13 wherein the mesh member is generally dome shaped.

15. The device as defined in claim 12 wherein the crucible means is contained within an enclosure and is induction heated.

16. The device as in claim 10, wherein said mesh member comprises an optically opaque porous mass, said optically opaque porous mass having a plurality of apertures formed therein, said apertures being dimensioned to absorb said material within said mesh member.

* * * * *